United States Patent [19]
Lii et al.

[11] Patent Number: 5,936,304
[45] Date of Patent: Aug. 10, 1999

[54] C4 PACKAGE DIE BACKSIDE COATING

[75] Inventors: Mirng-Ji Lii; George F. Raiser, both of Chandler; Ravi V. Mahajan; Brad Menzies, both of Tempe, all of Ariz.

[73] Assignee: Intel Corporation, Santa Clara, Calif.

[21] Appl. No.: 08/988,506

[22] Filed: Dec. 10, 1997

[51] Int. Cl.$^6$ .................................................. H01L 23/14

[52] U.S. Cl. .......................... 257/701; 257/737; 257/778

[58] Field of Search .................................... 257/737, 738, 257/778, 787, 701, 702

[56] References Cited

U.S. PATENT DOCUMENTS 5,311,059  5/1994  Banerji et al. ........................... 257/778
5,319,242  6/1994  Carney et al. ........................... 257/680

Primary Examiner—Teresa M. Arroyo
Assistant Examiner—Roy Potter
Attorney, Agent, or Firm—Blakely, Sokoloff, Taylor & Zafman

[57] ABSTRACT

According to one aspect of the invention there is provided a semiconductor chip comprising a semiconductor die, an array of electrical contacts on an integrated circuit in a frontside of the die, and a protective layer on a backside of the die.

28 Claims, 7 Drawing Sheets

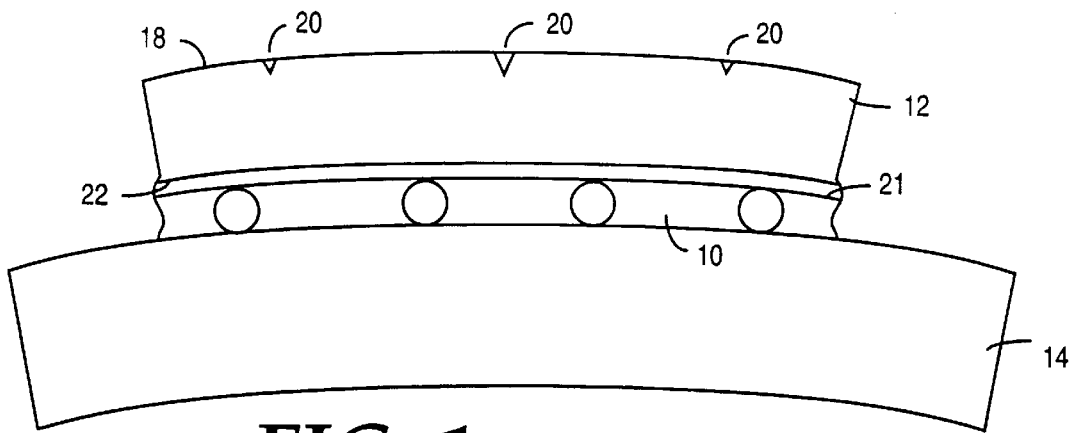
FIG. 1 *(PRIOR ART)*
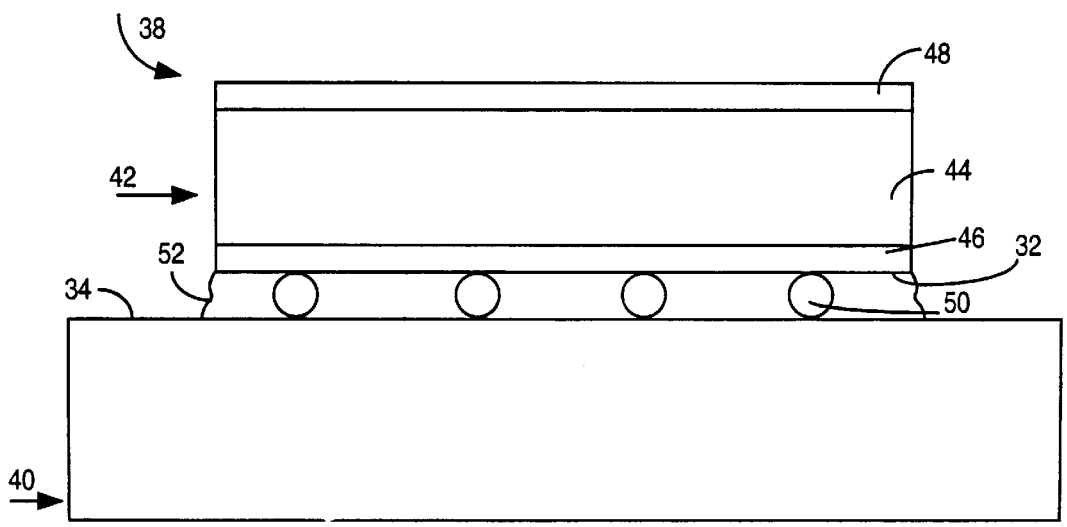
FIG. 2A

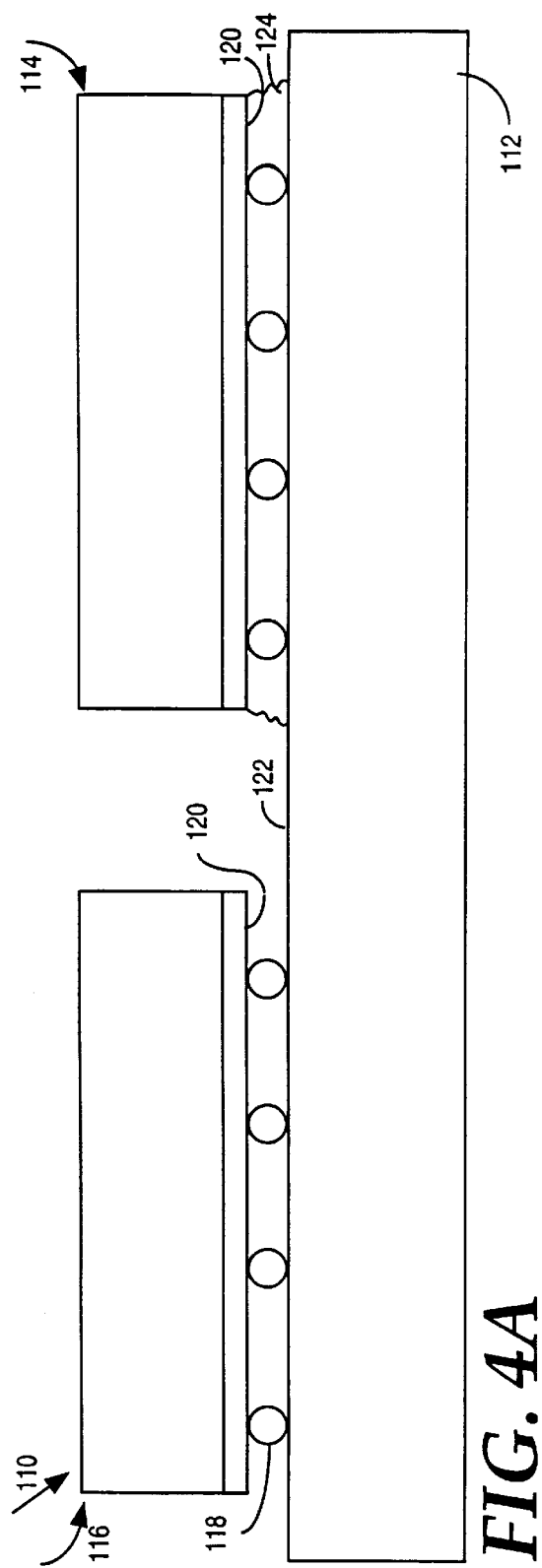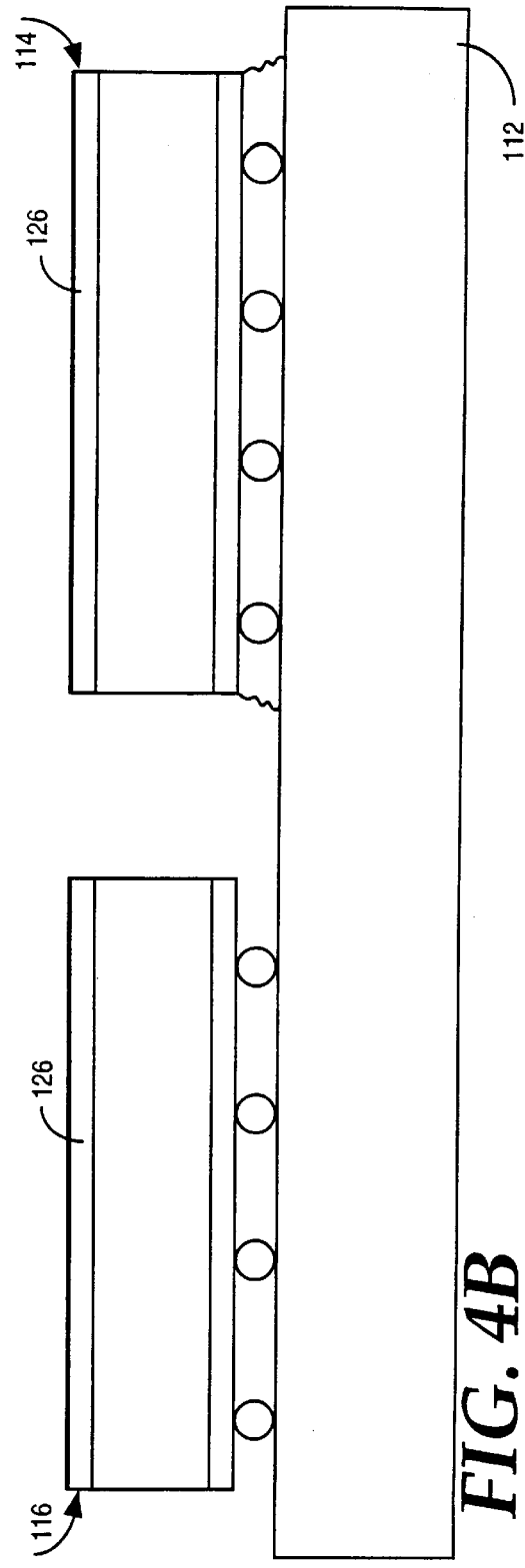

C4 PACKAGE DIE BACKSIDE COATING

BACKGROUND OF THE INVENTION

1). Field of the Invention

This invention relates to a semiconductor chip, a semiconductor package, to a method of assembling a semiconductor package, and to a method of producing a semiconductor chip.

2). Discussion of Related Art

The term "frontside" of a semiconductor wafer or semiconductor chip, as used herein, denotes the side of the semiconductor wafer or semiconductor chip which carries an integrated circuit, and the term "backside", as used herein, denotes a side of the semiconductor wafer or the semiconductor chip opposing the frontside.

A semiconductor package usually includes a package substrate and a semiconductor chip located on the package substrate. A semiconductor chip is often provided with C4 (controlled collapse chip connect) solder connections, on a frontside thereof, for purposes of electrically contacting an integrated circuit on the frontside of the chip to contact pads on the package substrate. An epoxy is typically introduced under capillary action into a space provided between the semiconductor chip and the package substrate and is cured. The epoxy acts to bond the semiconductor chip to the package substrate and to protect the fragile C4 solder connections.

The semiconductor chip is made primarily of silicon which has a coefficient of thermal expansion (CTE) of about 3.3 ppm/° C. (parts per million per ° C.). In the past, the package substrate was generally made of a ceramic material, which has a coefficient of thermal expansion that is typically below 6 ppm/° C. During heating or cooling of the semiconductor package the coefficients of thermal expansion of the semiconductor chip and the ceramic package substrate, respectively, were not of a magnitude which caused substantial bending of the semiconductor chip.

Ceramic has a relatively high dielectric constant which causes stray capacitance to build up within the package substrate, resulting in resistance-capacitance (RC) delay. The move in recent years has therefore been away from ceramic as a package substrate material to alternative materials, such as plastics or other organic materials, which have lower dielectric constants. A problem with these alternative materials is that they usually have relatively high coefficients of thermal expansion, compared to the coefficient of thermal expansion of the semiconductor chip. Some plastics materials, for example, have coefficients of thermal expansion of the order of 17 ppm/° C. Heating or cooling of the semiconductor package thus results in substantial bending of the semiconductor chip.

As discussed above and with reference to FIG. 1, an epoxy material 10, generally a glass-filled epoxy, is provided within the space between the semiconductor chip 12 and the package substrate 14 and cured. The step of curing the epoxy involves elevating the temperature of the semiconductor package 16 to a given temperature for a specific period of time. Once the curing procedure is complete, the semiconductor package is then cooled to ambient temperature. FIG. 1 illustrates an organic semiconductor package 16 after being cured and cooled to ambient temperature. Since the coefficient of thermal expansion of the organic package substrate 14 is much greater than the coefficient of thermal expansion of the semiconductor chip 12, the package substrate 14 tends to reduce in size during cooling at a much faster rate than the semiconductor chip 12. This causes the semiconductor package 16 to warp in a manner that results in outward bowing or bending of the semiconductor chip 12.

Bending or bowing of the semiconductor chip is problematic, in that it induces greater stresses along the backside 18 of the semiconductor chip. Surface defects 20, such as nicks and scratches, are generally present along the backside 18 of the semiconductor chip as a result of the process and handling procedures used during the manufacturing process. The bending or bowing of the chip can cause the surface defects to develop rapidly into larger cracks which propagate through the semiconductor chip. Propagation of the defects can cause severe damage to the chip, and can eventually cut through active circuitry 21 on a frontside 22 of the semiconductor chip, resulting in electrical failure of the semiconductor chip.

SUMMARY OF THE INVENTION

According to one aspect of the invention there is provided a semiconductor chip comprising a semiconductor die, an array of electrical contacts on an integrated circuit in a frontside of the die, and a protective layer on a backside of the die.

BRIEF DESCRIPTION OF THE DRAWINGS

The present invention is illustrated by way of example and is not limited by the figures of the accompanying drawings, in which like references indicate similar elements, and in which:

FIG. 1 is a side view of a prior art semiconductor package;

FIGS. 2A to 2C are side views of a semiconductor package, according to one embodiment of the invention, which is being cured;

FIGS. 4A and 4B are side views of a multi-chip module according to one embodiment of the invention;

FIGS. 7A to 7G illustrate the manufacture of a semiconductor chip, according to one embodiment of the invention.

DESCRIPTION OF THE INVENTION

Figure 2B:
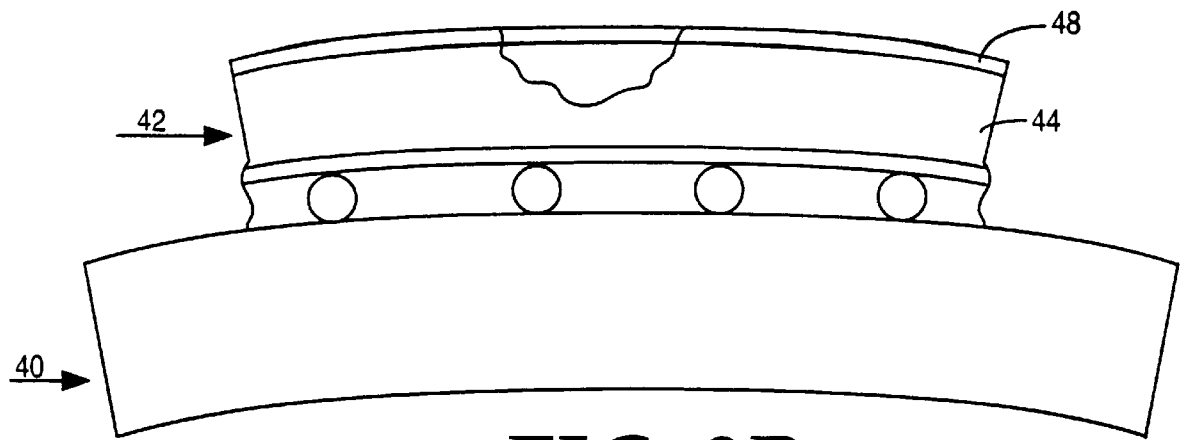

In the following description, for purposes of explanation, numerous specific details are set forth in order to provide a thorough understanding of the present invention. It will be evident, however, to one skilled in the art that the present invention may be practiced without these specific details. In other instances well known processes and methods have not been described in detail in order to not obscure the present invention.

FIG. 2A of the accompanying drawings illustrates a semiconductor package 38, according to one embodiment of the invention, which includes a package substrate 40 and a semiconductor chip 42 located on the package substrate 40.

The chip 42 includes a silicon die 44 with an integrated circuit 46 on a frontside of the die 44 and a protective layer 48 on a backside of the die.

The chip 42 and the package substrate 40 are electrically connected by an array of electrical contacts 50 positioned between a frontside 32 of the chip 42 and a surface 34 of the package substrate 40.

As previously discussed, the CTE of the silicon die 44 is typically lower than the CTE of package substrate 40. The CTE mismatch is particularly high when package substrate 44 is made of a plastics material or other organic material.

In accordance with the present invention, the protective layer 48 is chosen to have a CTE that is greater than the CTE of the silicon die 44. In this manner, a compressive force is developed along the backside of chip 42 by the protective layer 48 when the chip temperature transitions from a higher temperature to a lower temperature.

In one embodiment, the package substrate 40 is made of a material with a relatively high coefficient of thermal expansion. The material of the package substrate 40, for example, may be a plastics material or other organic material with a coefficient of thermal expansion of more than 6 parts per million per ° C. (ppm/° C.). Some organic or plastics materials which may be used may have coefficients of thermal expansions in the region of 17 ppm/° C.

The silicon die 44, on the other hand, has a relatively low coefficient of thermal expansion, typically in the region of about 3.3 ppm/° C.

The protective layer 48 is chosen to have a relatively high coefficient of thermal expansion, and typically has coefficient of thermal expansion of above 6 ppm/° C. The material of the protective layer 48 may be an organic material such as a plastics material, or a metal such as gold, aluminum, platinum or silver. A metal protective layer may be deposited utilizing known techniques such as plasma vapor deposition, chemical vapor deposition or physical vapor deposition. An organic protective layer may be deposited utilizing known techniques such as screen printing, or placing a film over the silicon die 44 followed by a curing step.

An underfill epoxy 52 is typically applied into a space between the package substrate 50 and the chip 42 to provide additional structural support and to protect the electrical contacts 50.

Once the underfill epoxy is applied, the semiconductor package 38 is sent through a furnace in order to cure the epoxy. The semiconductor package 38 is typically heated to about 120° C. for about 30 minutes, and then to about 150° C. for about 3 hours. After curing of the underfill epoxy 52, the package 38 is allowed to cool down to room temperature.

Because the coefficient of thermal expansion of the package substrate 40 is higher than the coefficient of thermal expansion of the die 44, the package substrate 40 decreases in size faster than the die 44, resulting in bending of the die 44 as illustrated in FIG. 2B.

Figure 2C:
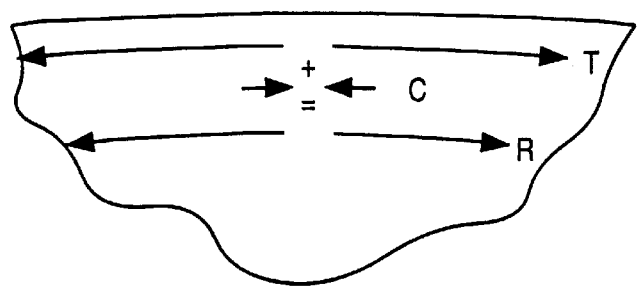

Referring to FIG. 2C, the bending of the die 44 results in a tensile stress T developing on the backside of the die 44. Should any cracks, scratches or other surface defects exist on the backside, the tensile stress T would cause these defects to propagate through the die 44, resulting in damage to the die 44 and, eventually, electrical failure of the chip 42.

However, due to the mismatch in the coefficient of thermal expansion of the die 44 and the protective layer 48, the protective layer 48 tends to reduce in size at a faster rate than the die 44 when cooling down, resulting in a compressive stress C developing on the backside.

The tensile stress T combined with compressive stress C cause a resultant tensile stress R, on the backside, which is less than the tensile stress T. Because the resultant tensile stress R is less than the tensile stress T, the likelihood of any surface defects on the backside of the die 44 propagating through the die is reduced.

The following table is based on a model of R/T for different materials and thicknesses for the protective layer:

|    | 10 μm. | 20 μm. | 30 μm. |
|----|--------|--------|--------|
| Au | 0.81   | 0.78   | 0.76   |
| Al | 0.91   | 0.89   | 0.87   |
| Pt | 0.74   | 0.73   | 0.72   |
| Ag | 0.80   | 0.76   | 0.73   |

The protective layer also fills the cracks. Filling the cracks reduces stress concentration and therefore also the likelihood that the cracks will propagate through the die 44.

The package may be subjected to an environment having contaminants such as acid containing particles or acid within the ambient environment. These contaminants, if they deposit or become resident within cracks on the backside of the die 42, may cause corrosion to the backside, thus enhancing the problem that the cracks may propagate through the die. The protective layer 48 thus also serves to protect the backside layer from environmental contaminants.

Figure 3:
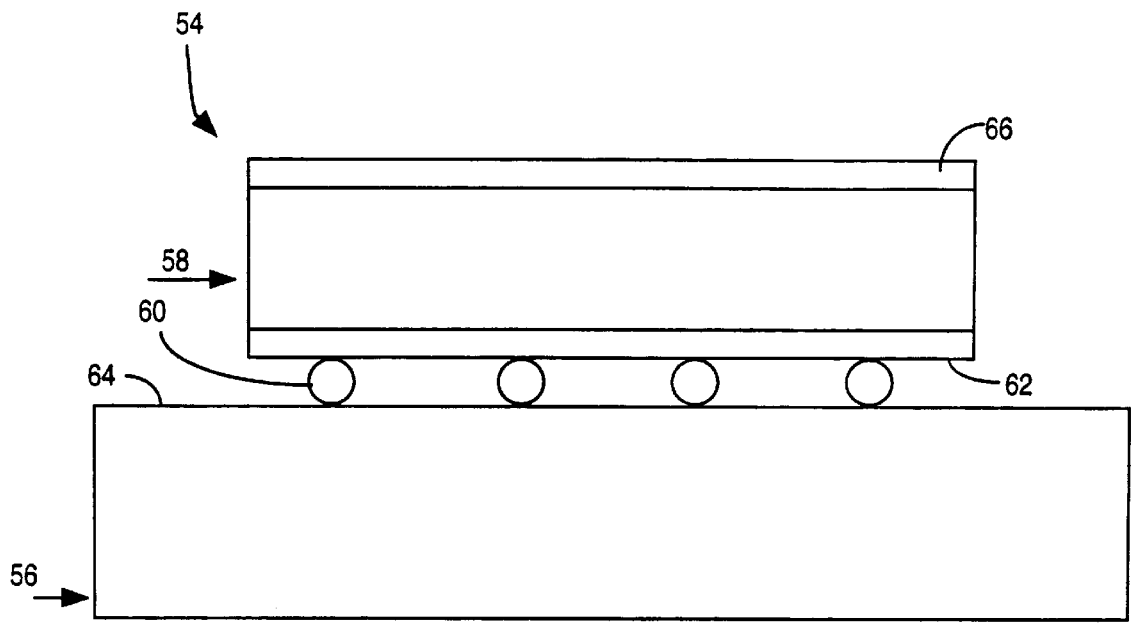
FIG. 3 is a side view of a semiconductor package according to another embodiment of the invention.

FIG. 3 illustrates semiconductor package 54 according to another embodiment of the invention, including a package substrate 56 and a chip 58 located on the package substrate 56. Electrical connection between the chip 56 and the package substrate 58 is made by an array of electrical contacts 60 positioned between a frontside 62 of the chip 56 and a surface 64 of the package substrate 56. Underfill epoxy is however not introduced between the package substrate 56 and the chip 58, as in the embodiment of FIG. 2, and the package 54 is simply sent through a reflow furnace which bonds the array of electrical contacts 60 to the package substrate 56. A protective layer 66 is formed on a backside of the chip 58. Once the package substrate 56 cools down to room temperature, the differences of the coefficients of thermal expansion of the package substrate 56 and the chip 58, respectively, causes the chip 58 to bend as hereinbefore described in reference to FIGS. 2B and 2C.

It should be noted that the protective layer 66 may be applied at any stage during the manufacture of the chip 42 or 58, after the manufacture of the chip, or even after application of the chip to the package substrate 40 or 56.

For example, FIG. 4A illustrates a multi-chip module 110 which includes a host device 112 such as a motherboard, card, printed circuit board, etc., having two semiconductor chips 114 and 116 located on the host device 112. Each chip 114 or 116 is electrically connected to the host device 112 by an array of electrical contacts 118 positioned between a frontside 120 of the chip 114 or 116 and a surface 122 of the host device 112. By way of example, one of the chips 114 has an underfill epoxy 124 bonding the chip 114 to the host device 122, while the other chip 116 is without underfill epoxy.

FIG. 4B illustrates a formation of the protective layer 126 on each of the chips 114 and 166 to render chips such as in FIGS. 2 and 3, respectively. The protective layer may be applied over the entire module, i.e. covering the chips 114 and 116 and portions of the host device 112, or may be applied through a mask wherein only respective areas, such as the backside of each of the chips 114 and 116, are targeted.

The protective layer 126 is preferably applied at an elevated temperature during or after curing or reflow of the multi-chip module 110 so that a higher compressive stress C is developed when the multi-chip module 110 cools down, when compared to applying the protective layer 126 at lower temperatures.

Figure 5:
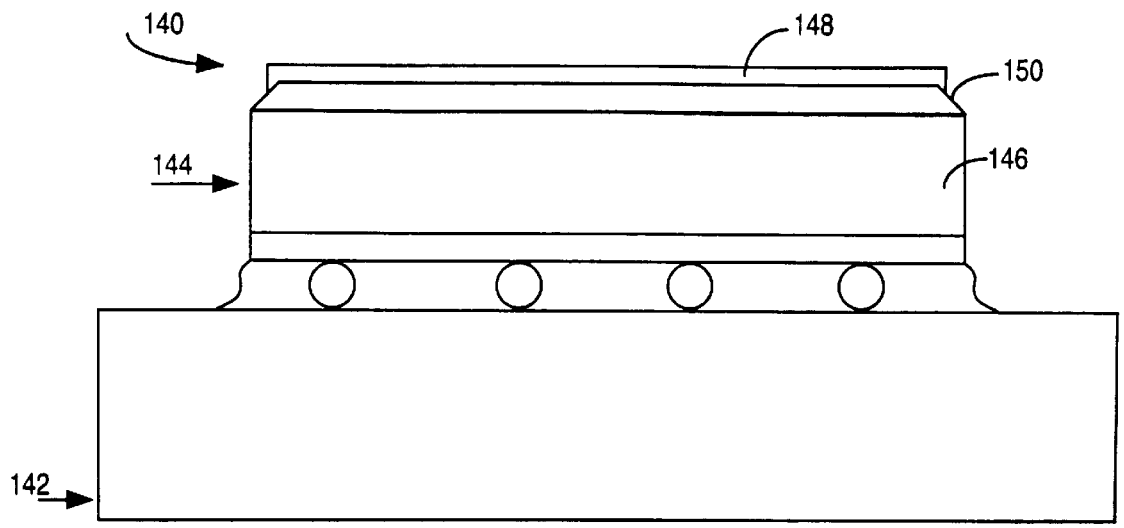
FIG. 5 is a side view of a semiconductor package according to a yet another embodiment of the invention.

FIG. 5 illustrates a semiconductor package 140 according to yet another embodiment of the invention, which includes a package substrate 142 and a semiconductor chip 144 located on the substrate 142 in a manner which is similar to the embodiment of FIG. 1. The chip 144 comprises a die 146 and a protective layer 148 is deposited on a backside of the die 146. A beveled edge 150 is formed on the backside of the die 146 either before or after the protective layer 148 is deposited on the backside. Cornered backside edges are problematic in that stress concentrations are higher along the cornered edges. In addition, nicks, scratches, or other surface defects often exist on such edges because of the sawing operation used in cutting the chips. The beveled edge 150 on the backside of the die 146 thus firstly serves to reduce stress concentrations which develop on edges of the backside of the die 146 and, secondly, provides the backside of the die 146 with an edge which is finished off to reduce the number of nicks, scratches, or other surface defects that can propagate through the die 146, causing severe damage thereto.

It should be noted that the shape of the beveled edge 150 is not limited to any specific geometric configuration. The beveled edge 150 can take on any form, such as rounded or angular configurations.

Figure 6:
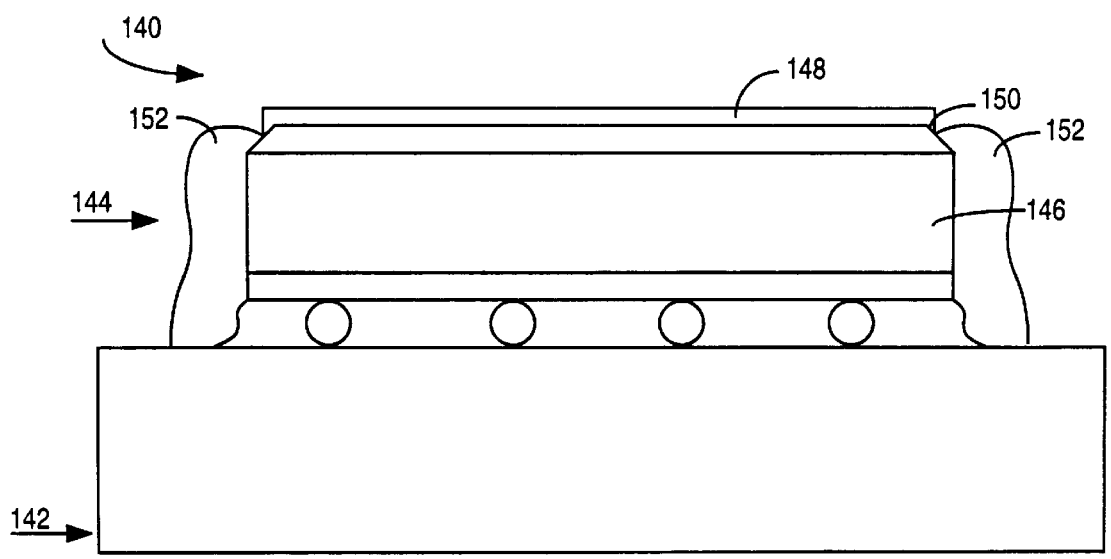
FIG. 6 is a side view of a semiconductor package according to another embodiment of the invention.
Figure 7A:
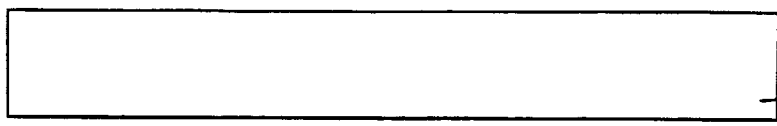
Figure 7B:
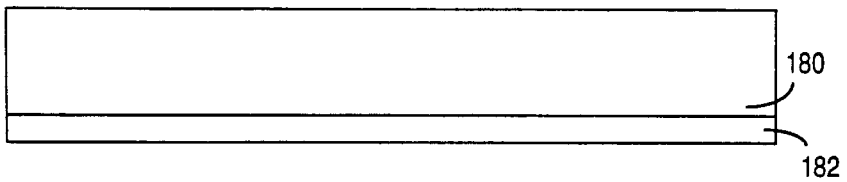
Figure 7C:
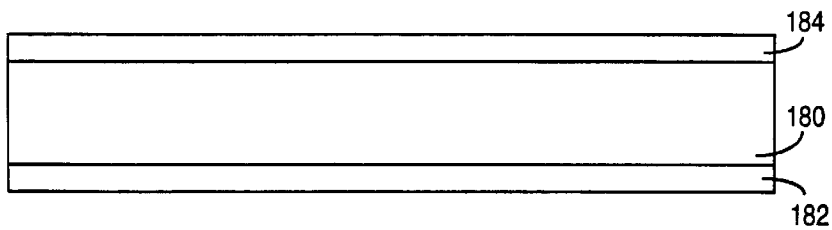
Figure 7D:
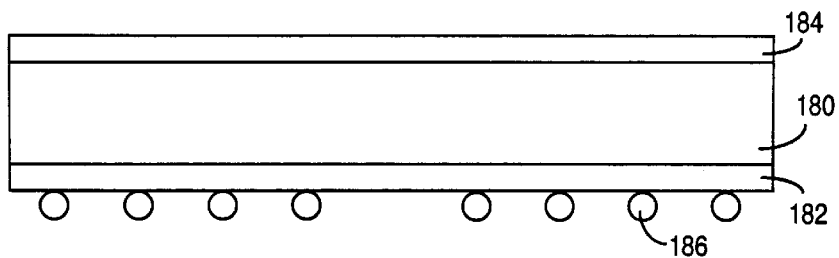
Figure 7E:
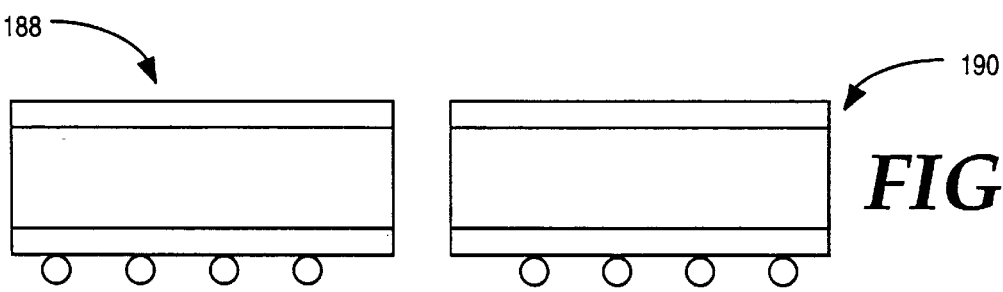
Figure 7G:
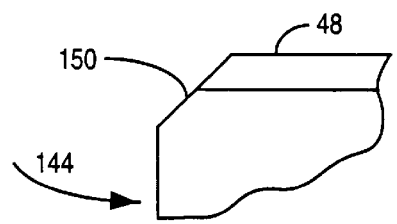

FIG. 6 illustrates a semiconductor package 140 according to another embodiment of the invention, which is similar to FIG. 5 except that an epoxy fillet 152 is applied to the package substrate 142 about a periphery of the chip 144 so as to cover a side of the chip 144 up to a position on the beveled edge 150. The epoxy fillet 152 serves to reduce tensile and shear stresses, which tend to delaminate the chip 144 from the package substrate 142, by acting to distribute these stresses over a larger area.

A further advantage of the epoxy fillet 152 is that it covers and seals minor defects that remain on the surface of the beveled edge 150, thus reducing the chances that these defects will propagate through the chip 144.

FIG. 7 illustrates the manufacture of semiconductor chips wherein the protective layer is formed during manufacture of the chips. FIG. 7A illustrates a wafer 180, FIG. 7B illustrates the wafer 180 with an integrated circuit 182 formed on a frontside thereof, FIG. 7C illustrates the wafer of FIG. 7B with a protective layer 184 formed on a backside of the wafer 180, and FIG. 7D illustrates a wafer of FIG. 7C after the formation of an array of electrical contact 186 on the integrated circuit. The wafer is then cut, as illustrated in FIG. 7E, into the separate chips 188 and 190. The chips 188 and 190 may be of the kind shown in FIGS. 2, 3, 5, or 6, FIG. 7G, for example, illustrates the chip 144 of FIGS. 5 and 6 wherein the beveled edge 150 is cut on the edge of the chip 144 after forming the protective layer 148 thereon.

Figure 8A:
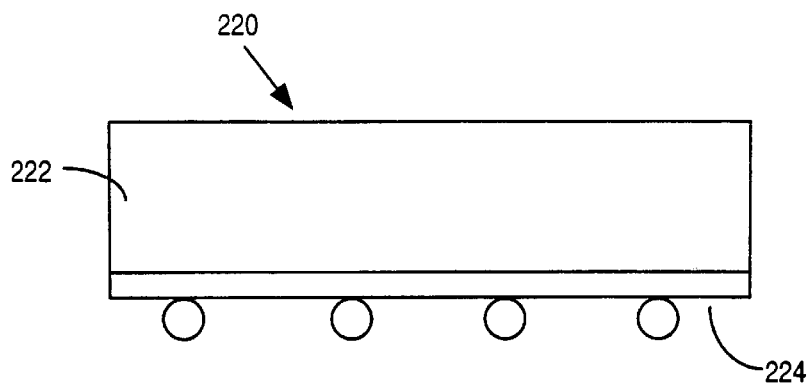
FIGS. 8A and 8B illustrate the manufacture of a semiconductor chip, according to another embodiment of the invention.
Figure 8B:
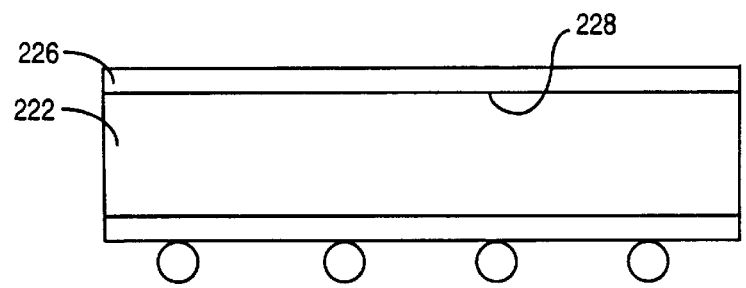

As illustrated in FIGS. 8A and 8B, the protective layer may also be formed after cutting the wafer into the respective dies. FIG. 8A illustrates a semiconductor chip 220 comprising a silicon die 222 having an integrated circuit 224 formed on the frontside of the die 222. FIG. 8B illustrates the formation of a protective layer 226 on a backside 228 of the die 222.

As noted earlier, FIGS. 4A and 4B, 7A to 7E and 8A and 8B, respectively illustrate that the protective layer may be applied at any stage during the manufacture of the chip, after manufacture of the chip or even after application of the chip to the package substrate or other device.

What is claimed:

1. A semiconductor chip comprising:
    a semiconductor die having a backside with a beveled edge;
    an array of electrical contacts on an integrated circuit in a frontside of the die; and
    a protective layer on a backside of the die.

2. The chip of claim 1 wherein the die has a first coefficient of thermal expansion, and the protective layer has a second coefficient of thermal expansion which is greater than the first coefficient of thermal expansion.

3. The chip of claim 2 wherein the second coefficient of thermal expansion is at least 2.7 ppm/° C. greater than the first coefficient of thermal expansion.

4. The chip of claim 1 wherein the protective layer is of a material selected from the group consisting of: gold, aluminum, platinum, silver.

5. The chip of claim 1 wherein the protective layer is of an organic material.

6. The chip of claim 1 wherein the protective layer is of a plastics material.

7. The chip of claim 1 wherein the protective layer is at least 10 $\mu$m thick.

8. The chip of claim 1 wherein the array of electrical contacts is an array of solder connections.

9. The chip of claim 1 wherein the array of electrical contacts is an array of gold bumps.

10. The chip of claim 1 wherein the protective layer is under tensile stress.

11. The chip of claim 1 wherein the protective layer is made of a non-conductive material.

12. The chip of claim 1 wherein the die has a first coefficient of thermal expansion and the protective layer has a second coefficient of thermal expansion which is greater than the first coefficient of thermal expansion.

13. A semiconductor chip comprising:
    a semiconductor die which has a first coefficient of thermal expansion;
    an array of electrical contacts on an integrated circuit in a frontside of the die; and
    a non-conductive protective layer on the backside of the die, the non-conductive protective layer having a second coefficient of thermal expansion which is greater than the first coefficient of thermal expansion.

14. The chip of claim 13 wherein the protective layer is of an organic material.

15. The chip of claim 13 wherein the protective layer is of a plastics material.

16. A semiconductor package comprising:
    a package substrate having a first coefficient of thermal expansion; and
    a semiconductor chip comprising:
        a semiconductor die having a second coefficient of thermal expansion which is less than the first coefficient of thermal expansion;
        an array of electrical contacts on an integrated circuit in a frontside of the die; and
        a protective layer, having a third coefficient of thermal expansion which is greater than the second coefficient of thermal expansion, on a backside of the die, the chip being located on the substrate with the electrical contacts electrically contacting the package substrate and with the protective layer being disconnected from the substrate.

17. The package of claim 16 wherein the second coefficient of thermal expansion is at least 2.7 ppm/° C. less than the first coefficient of thermal expansion.

18. The package of claim 16 wherein the third coefficient of thermal expansion is at least 2.7 ppm/° C. greater than the second coefficient of thermal expansion.

19. The package of claim 16 wherein the protective layer is of a material selected from the group consisting of: gold; aluminum; platinum; silver.

20. The package of claim 16 wherein the protective layer is of an organic material.

21. The package of claim 16 wherein the protective layer is of a plastics material.

22. The package of claim 16 wherein the protective layer is at least 10 $\mu$m thick.

23. The package of claim 16 wherein the backside has a beveled edge.

24. The package of claim 23 which includes:
   an epoxy fillet extending from the package substrate to a point on the beveled edge.

25. A semiconductor package comprising:
   a package substrate;
   a semiconductor chip comprising:
   a semiconductor die having a backside with a beveled edge;
   an array of electrical contacts on an integrated circuit in a frontside of the die; and
   a protective layer on a backside of the die, the chip being located on the substrate with the electrical contacts electrically contacting the package substrate.

26. The package of claim 26 wherein the package substrate has a first coefficient of thermal expansion, the die has a second coefficient of thermal expansion which is less than the first coefficient of thermal expansion and the protective layer has a third coefficient of thermal expansion which is greater than the second coefficient of thermal expansion.

27. The package of claim 26 wherein the protective layer is made of a non-conductive material.

28. The package of claim 26 wherein the protective layer is under tensile stress.

* * * * *

UNITED STATES PATENT AND TRADEMARK OFFICE
CERTIFICATE OF CORRECTION

PATENT NO.    : 5,936,304
DATED         : August 10, 1999
INVENTOR(S)   : Lii et al.

It is certified that error appears in the above-identified patent and that said Letters Patent is hereby corrected as shown below:

Column 8,
Line 9, delete "claim 26" and insert -- claim 25 --.
Line 15, delete "claim 26" and insert -- claim 25 --.
Line 17, delete "claim 26" and insert -- claim 25 --.

Signed and Sealed this

Twenty-seventh Day of May, 2003

JAMES E. ROGAN
*Director of the United States Patent and Trademark Office*